United States Patent
Machida

(10) Patent No.: US 8,772,836 B2
(45) Date of Patent: Jul. 8, 2014

(54) SEMICONDUCTOR DEVICE

(75) Inventor: Osamu Machida, Niiza (JP)

(73) Assignee: Sanken Electric Co., Ltd., Niiza-Shi (JP)

( * ) Notice: Subject to any disclaimer, the term of this patent is extended or adjusted under 35 U.S.C. 154(b) by 374 days.

(21) Appl. No.: 13/042,519

(22) Filed: Mar. 8, 2011

(65) Prior Publication Data

US 2011/0233615 A1 Sep. 29, 2011

(30) Foreign Application Priority Data

Mar. 26, 2010 (JP) ................. 2010-073269

(51) Int. Cl.
*H01L 29/66* (2006.01)

(52) U.S. Cl.
USPC ............. 257/195; 257/20; 257/76; 257/133; 257/146; 257/155; 257/162; 257/183; 257/192; 257/194; 257/472; 257/613; 257/E29.072; 257/E29.242; 257/E29.24; 257/E21.361; 257/E21.403; 438/92; 438/94; 438/141; 438/172; 438/191; 438/597; 438/604

(58) Field of Classification Search
USPC .............. 257/20, 76, 133, 146, 155, 162, 183, 257/192, 194, 195, 472, 613, 615, E29.072, 257/E29.242, E29.246, E21.361, E21.403; 438/92–94, 141, 172, 191, 597, 604
See application file for complete search history.

(56) References Cited

U.S. PATENT DOCUMENTS

| | | | | |
|---|---|---|---|---|
| 8,368,121 B2 * | 2/2013 | Xin et al. | .................. | 257/195 |
| 2002/0070412 A1 | 6/2002 | Mitlehner et al. | | |
| 2006/0175633 A1 | 8/2006 | Kinzer | | |
| 2007/0102727 A1 | 5/2007 | Twynam | | |
| 2008/0315257 A1 | 12/2008 | Shiraishi | | |
| 2009/0166677 A1 | 7/2009 | Shibata et al. | | |
| 2009/0189191 A1 | 7/2009 | Sato et al. | | |
| 2010/0078683 A1 | 4/2010 | Baba et al. | | |
| 2010/0155780 A1 | 6/2010 | Machida et al. | | |

FOREIGN PATENT DOCUMENTS

| | | |
|---|---|---|
| JP | 2000-286428 A | 10/2000 |
| JP | 2003-229566 A | 8/2003 |
| JP | 2004-31896 A | 1/2004 |
| JP | 2006-310769 A | 11/2006 |
| JP | 2007-59882 A | 3/2007 |
| JP | 2007-150282 A | 6/2007 |
| JP | 2007-250792 A | 9/2007 |
| JP | 2007-266475 A | 10/2007 |
| JP | 2008-16682 A | 1/2008 |
| JP | 2008-219021 A | 9/2008 |
| JP | 2008-227536 A | 9/2008 |
| JP | 2008-244505 A | 10/2008 |

(Continued)

*Primary Examiner* — Meiya Li
(74) *Attorney, Agent, or Firm* — Birch, Stewart, Kolasch & Birch, LLP

(57) ABSTRACT

To provide a semiconductor device in which a rectifying element capable of reducing a leak current in reverse bias when a high voltage is applied and reducing a forward voltage drop Vf and a transistor element are integrally formed on a single substrate.

A semiconductor device has a transistor element and a rectifying element on a single substrate. The transistor element has an active layer formed on the substrate and three electrodes (source electrode, drain electrode, and gate electrode) disposed on the active layer. The rectifying element has an anode electrode disposed on the active layer, a cathode electrode which is the drain electrode, and a first auxiliary electrode between the anode electrode and cathode electrode.

6 Claims, 13 Drawing Sheets

(56) References Cited

FOREIGN PATENT DOCUMENTS

| | | |
|---|---|---|
| JP | 2008-277598 A | 11/2008 |
| JP | 2008-277641 A | 11/2008 |
| JP | 2008-306200 A | 12/2008 |
| JP | 2009-4398 A | 1/2009 |
| JP | 2009-76845 A | 4/2009 |
| JP | 2009-135226 A | 6/2009 |
| JP | 2009-164158 A | 7/2009 |
| JP | 2009-182107 A | 8/2009 |
| JP | 2009-218528 A | 9/2009 |
| JP | 2009-246045 A | 10/2009 |
| JP | 2009-246276 A | 10/2009 |
| JP | 2010-87274 A | 4/2010 |
| JP | 2010-147387 A | 7/2010 |
| WO | WO 00/60670 A1 | 10/2000 |

* cited by examiner (a)

(b)

(Prior Art)

SEMICONDUCTOR DEVICE

BACKGROUND OF THE INVENTION

1. Field of the Invention

The present invention relates to a semiconductor device and, more particularly, to a semiconductor device having a transistor element and a rectifying element on a single substrate.

2. Description of the Related Art

Conventionally, there has been proposed a semiconductor device in which a transistor element and a rectifying element are formed on a single substrate. In the case where a rectifying element needs to be added to a single substrate on which a lateral field-effect transistor (FET) utilizing a two-dimensional electron gas layer is formed, a structure as illustrated in FIG. 13 can be considered (refer to, e.g., Patent Document 1).

As illustrated in FIG. 13, a semiconductor device 200 has a hetero junction 101 of nitride semiconductors disposed on a substrate 100. The hetero junction 101 is formed between a first nitride semiconductor 103 formed on the substrate 100 through a buffer layer 102 and a second nitride semiconductor 104 formed above the first nitride semiconductor 103. The first nitride semiconductor 103 has a two-dimensional electron gas layer at the vicinity of the hetero junction 101. A source electrode 105 and drain electrode 106 ohmic-contacting with two-dimensional electron gas are provided on the second nitride semiconductor 104. A gate electrode 107 is formed on the second nitride semiconductor 104 at a portion between the source and drain electrodes 105 and 106. A Schottky electrode 108 Schottky-contacting with the second nitride semiconductor 104 is formed on the second nitride semiconductor 104 at a portion on the opposite side to the gate electrode 107 with respect to the drain electrode 106. As described above, a rectifying element 109 having the Schottky electrode 108 as the anode electrode and drain electrode 106 as the cathode electrode is formed, whereby the semiconductor device 200 having the transistor element 110 and rectifying element 109 on the single substrate 100 is formed.

In the case where a high-voltage and high-speed GaN based semiconductor device is produced, in order to allow the semiconductor device to operate at high speed, it is preferable to make the anode electrode have a Schottky barrier diode (SBD) structure using a Schottky electrode suitable for high-speed operation.

CITATION LIST

Patent Document

[Patent Document 1] Jpn. Pat. Appln. Laid-Open Publication No. 2006-310769

However, the use of the Schottky electrode may cause a large leak current in reverse bias when a high voltage is applied. When a Schottky electrode having a high Schottky barrier is adopted in order to reduce the leak current in reverse bias, there occurs a problem that a forward voltage drop Vf becomes large.

SUMMARY OF THE INVENTION

The present invention provides a semiconductor device in which a rectifying element capable of reducing a leak current in reverse bias when a high voltage is applied and reducing a forward voltage drop Vf and a transistor element are integrally formed on a single substrate.

According to the present invention, there is provided a semiconductor device including a transistor element and a rectifying element on a single substrate. The transistor element has an active layer formed on the substrate, a source electrode, a drain electrode, and a gate electrode, the source, drain, and gate electrodes being disposed on the active layer. The rectifying element has an anode electrode disposed on the active layer, a cathode electrode which is the drain electrode, and an auxiliary electrode which is formed between the anode electrode and cathode electrode. The active layer has a first nitride semiconductor layer, a second nitride semiconductor layer formed on the first nitride semiconductor layer forming a heterojunction therebetween, and a two-dimensional carrier gas layer formed in the first nitride semiconductor layer (corresponding to claim 1).

DETAILED DESCRIPTION OF THE PREFERRED EMBODIMENTS

Preferred embodiments of the present invention will be described below with reference to the accompanying drawings.

Figure 1:
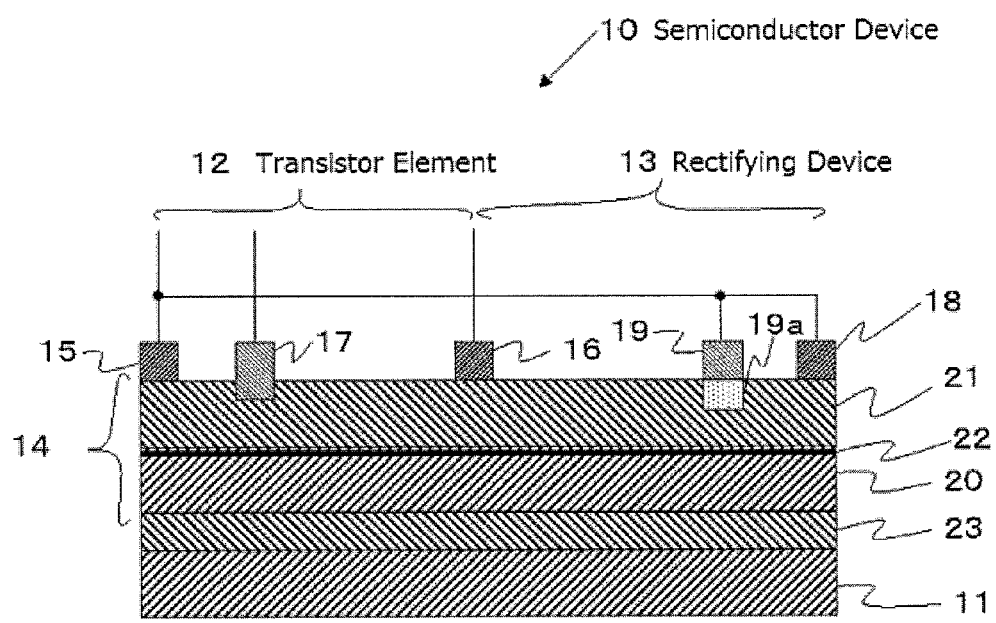
FIG. 1 is a cross-sectional view of a semiconductor device according to a first embodiment of the present invention.

FIG. 1 is a cross-sectional view of a semiconductor device according to a first embodiment of the present invention. The semiconductor device 10 has a transistor element 12 and a rectifying element 13 on a single substrate 11. The transistor element 12 has an active layer 14 formed on the substrate 11 and three electrodes (source electrode 15, drain electrode 16, and gate electrode 17) formed on the active layer 14. The rectifying element 13 has an anode electrode 18 formed on the active layer 14, a cathode electrode which is the drain electrode 16, and a first auxiliary electrode 19 between the anode electrode 18 and cathode electrode.

The active layer 14 has a first nitride semiconductor layer (channel layer (carrier traveling layer)) 20, a second nitride semiconductor layer (barrier layer (carrier supplying layer) 21 formed on the first nitride semiconductor layer 20 forming a heterojunction therebetween, and a two-dimensional carrier gas layer 22 formed in the first nitride semiconductor layer 20. Further, a buffer layer 23 is formed between the substrate 11 and first nitride semiconductor layer 20.

The material of the substrate 11 may be silicon carbide, sapphire, spinel, ZnO, silicon, gallium nitride compound, aluminum nitride compound, or any other material on which a group-III nitride material can grow. In the present embodiment, the substrate 11 is formed of silicon.

The buffer layer 23 is generated on the substrate 11 so as to reduce lattice mismatch between the substrate 11 and channel layer 20. The film thickness of the buffer layer 23 may preferably be about 1000 Å but may be set to any suitable value. The buffer layer 23 can be formed of many different materials, and an appropriate material thereof is $Al_xGa_{1-x}N$ ($0 \le x \le 1$). In the present embodiment, the buffer layer has a structure in which GaN ($Al_{x1}Ga_{1-x1}N$, x1=0) and AlGaN ($Al_{x2}Ga_{1-x2}N$, x2=1) are repeatedly laminated.

The buffer layer 23 can be formed on the substrate 11 by using a known semiconductor growth method such as a metal-organic vapor phase epitaxy (MOVPE) or a molecular beam epitaxy (MBE).

The semiconductor device 10 further has a channel layer 20 formed on the buffer layer 23. An appropriate channel layer 20 is formed of a group-III nitride material such as $Al_{y1}Ga_{y2}In_{(1-y1-y2)}N$ ($0 \le y1 < 1$, $0 \le y2 \le 1$, $y1+y2 \le 1$). In the present embodiment, the channel layer 20 is formed of a non-doped GaN layer having a film thickness of about 2 μm. The channel layer 20 can be formed on the buffer layer 23 by using a known semiconductor growth method such as a metal-organic vapor phase epitaxy (MOVPE) or a molecular beam epitaxy (MBE).

Further, a barrier layer 21 is formed on the channel layer 20 in the semiconductor device 10. The channel layer 20 and barrier layer 21 are each formed of a doped or undoped group-III nitride material. The barrier layer 21 is formed of a layer of InGaN, AlGaN, or AlN or a plurality of layers of a combination of different materials selected from InGaN, AlGaN, and AlN. In the present embodiment, the barrier layer 21 is formed of $Al_zGa_{1-z}N$ ($0 < z \le 1$) having a thickness of 22.5 nm. The two-dimensional electron gas (2DEG) layer 22 is formed in the channel layer 20 at the vicinity of the hetero interface between the channel layer 20 and barrier layer 21. The electrical isolation between devices is made by means of a mesa etching or ion injection method outside the semiconductor device 10. The barrier layer 21 can be formed on the channel layer 20 by using a known semiconductor growth method such as a metal-organic vapor phase epitaxy (MOVPE) or a molecular beam epitaxy (MBE).

Further, the transistor element 12 of the semiconductor device 10 has a metal source electrode 15 and a metal drain electrode 16 formed so as to be spaced away from each other, and the rectifying element 13 has a metal anode electrode 18 formed at a portion on the opposite side to the source electrode 15 with respect to the drain electrode 16 so as to be spaced away from the drain electrode 16. The metal that can be used for these electrodes includes, e.g., titanium, aluminum, gold, and nickel alloy but may include other suitable materials. The source electrode 15, drain electrode 16, and anode electrode 18 are each ohmic-contact with the two-dimensional electron gas (2DEG) layer 22.

The gate electrode 17 of the transistor element 12 is formed between the source electrode 15 and drain electrode 16. The metal that can be used for the gate electrode 17 includes gold, nickel, palladium, iridium, titanium, chromium, alloy of titanium and tungsten, and platinum silicide but may include other suitable materials.

The first auxiliary electrode 19 of the rectifying element 13 is formed between the drain electrode 16 serving as the cathode electrode and anode electrode 18. The metal that can be used for the first auxiliary electrode 19 includes gold, nickel, palladium, iridium, titanium, chromium, alloy of titanium and tungsten, and platinum silicide but may include other suitable materials. The first auxiliary electrode 19 has a function of controlling current flowing between the drain electrode 16 and anode electrode 18. That is, when the potential of the first auxiliary electrode 19 is lower than that of the drain electrode 16, the carrier density of the 2DEG immediately below the first auxiliary electrode is reduced. Further, as illustrated in FIG. 1, the first auxiliary electrode 19 is preferably provided inside of a recess structure formed in the barrier layer 21. Further, it is preferable to form a p-type semiconductor layer, a p-type metal oxide semiconductor layer, or insulating layer between the first auxiliary electrode 19 and barrier layer 21. An Mg-doped GaN layer, a nickel oxide layer, and an aluminum oxide layer may be used as the p-type semiconductor layer, p-type metal oxide semiconductor layer, and insulating layer, respectively. In the present embodiment, a p-type semiconductor later 19a is formed between the first auxiliary electrode 19 and barrier layer 21.

Further, as illustrated in FIG. 1, the source electrode 15, anode electrode 18, and first auxiliary electrode 19 are electrically connected.

Figure 2:
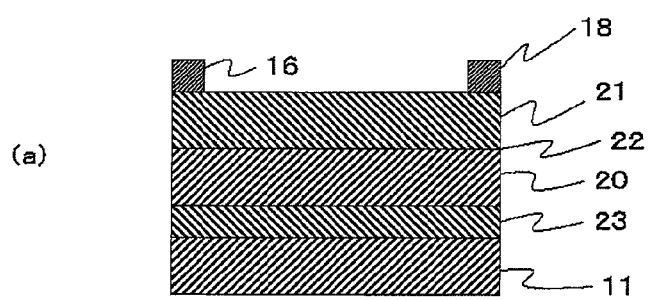
FIG. 2A is a view illustrating a structure in which a auxiliary electrode is not formed.
FIG. 2B is a view illustrating current-voltage characteristics of the structure of FIG. 2A.
Figure 2:
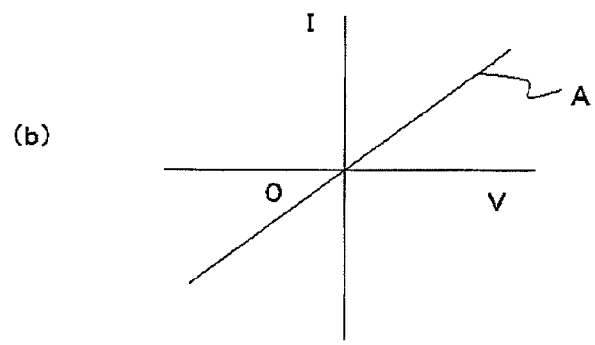
Figure 3:
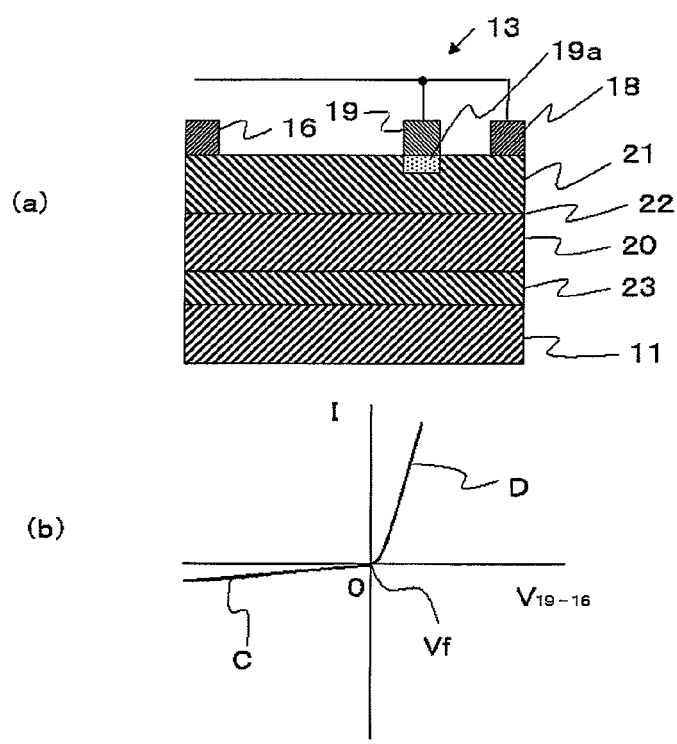
FIG. 3A is a view illustrating a structure of a rectifying element of the semiconductor device according to the first embodiment of the present invention.
FIG. 3B is a view illustrating current-voltage characteristics of the structure of FIG. 3A.
Figure 4:
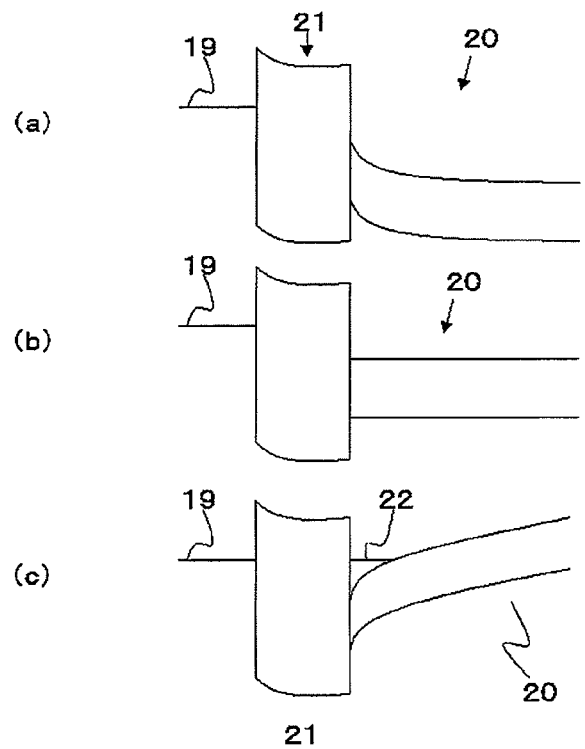
FIGS. 4A to 4C are band diagrams of a junction among the auxiliary electrode, barrier layer, and channel layer.

Next, operation of the semiconductor device 10 according to the first embodiment of the present invention will be described with reference to FIGS. 2 to 4.

FIG. 2A is a view illustrating a structure in which the first auxiliary electrode 19 is not formed. FIG. 2B is a view illustrating current-voltage characteristics of the structure of FIG. 2A. The current-voltage characteristics obtained when a voltage is applied between the anode 18 and cathode 16 exhibit ohmic characteristics as represented by a straight line A of FIG. 2B.

FIG. 3A is a view illustrating a structure of the rectifying element 13 of the semiconductor device 10 according to the first embodiment of the present invention, which is obtained by adding the first auxiliary electrode 19 to the structure illustrated in FIG. 2A. FIG. 3B is a view illustrating current-voltage characteristics of the structure of FIG. 3A. FIGS. 4A to 4C are band diagrams of a junction among the first auxiliary electrode 19, barrier layer 21, and channel layer 20.

When a voltage lower than that applied to the drain electrode 16 is applied to the anode electrode 18, the same voltage is applied to the first auxiliary electrode 19. The band diagram at that time is as illustrated in FIG. 4A. That is, the two-dimensional electron gas layer is not formed in the channel layer 20, so that the number of carriers is so small that current hardly flows between the anode 18 and cathode 16 (area C of FIG. 3B). As the abovementioned voltage is increased in the positive direction, the band diagram is as illustrated in FIG. 4B at the voltage Vf, which is so-called a flat band state. As the voltage is further increased in the positive direction, the band diagram is as illustrated in FIG. 4C. That is, the two-dimensional electron gas layer 22 is formed in the channel layer 20, and the density of two-dimensional electron gas increases with the increased voltage. As a result, current flows between the anode 18 and cathode 16, and the amount of the current increases with increased voltage (area D of FIG. 3B). As described above, the rectifying element 13 has rectifying characteristics.

The abovementioned voltage (forward voltage drop) Vf is a voltage applied to the first auxiliary electrode 19 when the flat band state of the band diagram (FIG. 4B is achieved, and this voltage has the same meaning as a gate threshold voltage Vth in the case where the first auxiliary electrode 19 is regarded as the gate electrode of the transistor. By forming the channel layer 20, barrier layer 21, and first auxiliary electrode 19 so as to reduce the voltage at which the flat band of the band diagram (FIG. 4B), the rectifying element 13 can have a reduced forward voltage drop Vf. The leak current in the reverse direction is determined by the structure of the first auxiliary electrode 19, so that it is preferable to use the p-type semiconductor material or insulating material in the first auxiliary electrode 19 at a portion between the first auxiliary electrode 19 and the surface of the barrier layer 21 so as to prevent injection of the carriers from the first auxiliary electrode 19 to the barrier layer 21.

As described above, there can be provided a semiconductor device 10 in which the rectifying element 13 capable of reducing a leak current when a high voltage is applied in the reverse direction and reducing a Vf (forward voltage drop) and the transistor element 12 are integrally formed on the single substrate 11.

Figure 5:
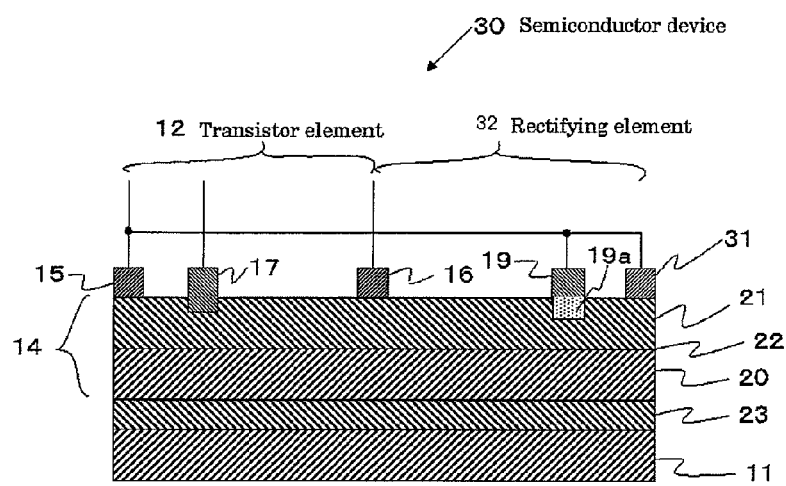
FIG. 5 is a cross-sectional view of a semiconductor device according a second embodiment of the present invention.

Next, a semiconductor device according to a second embodiment of the present invention will be described. As illustrated in FIG. 5, in the second embodiment, a low VF rectifying electrode configured by a Schottky electrode is used as an anode electrode 31 of a semiconductor device 30. For example, Ti, W, or the like is used to form the rectifying electrode. The other components are the same as those of the first embodiment, so that the same reference numerals are given to the same components, and the descriptions thereof are omitted.

Figure 6:
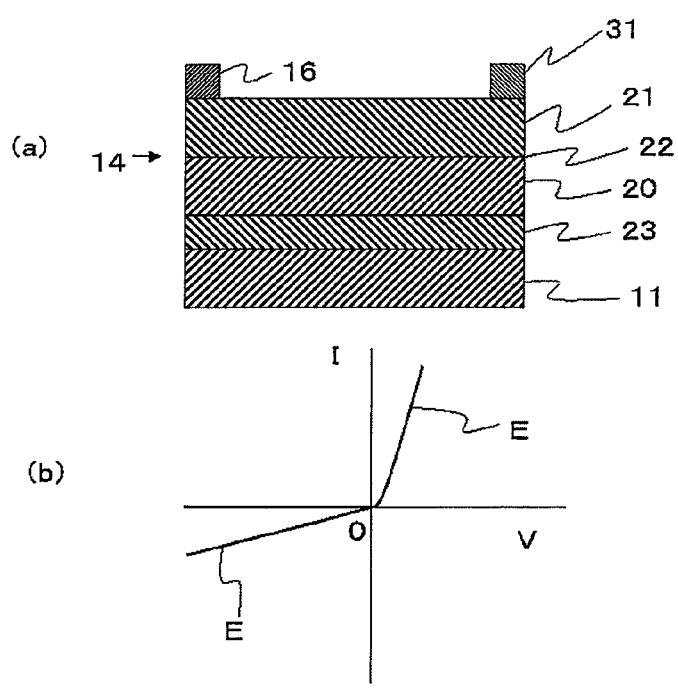
FIG. 6A is a view illustrating a structure in which a auxiliary electrode is not formed.
FIG. 6B is a view illustrating current-voltage characteristics of the structure of FIG. 6A.

Next, operation of the semiconductor device 30 according to the second embodiment of the present invention will be described with reference to FIG. 6.

FIG. 6A is a view illustrating a structure in which the first auxiliary electrode 19 is not formed. FIG. 6B is a view illustrating current-voltage characteristics of the structure of FIG. 6A. The current-voltage characteristics obtained when a voltage is applied between an anode electrode 31 and cathode electrode 16 exhibit characteristics as represented by a curve E of FIG. 6B.

Figure 7:
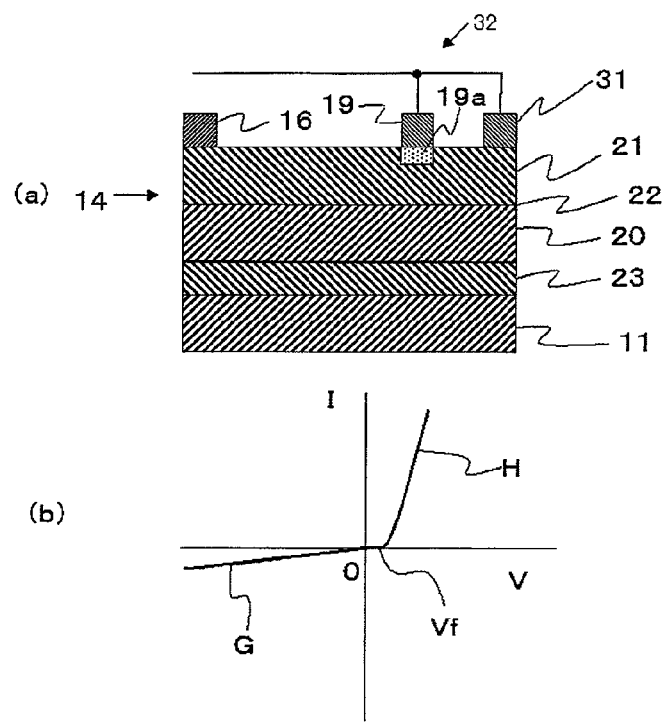
FIG. 7A is a view illustrating a structure of a rectifying element of the semiconductor device according to the second embodiment of the present invention.
FIG. 7B is a view illustrating current-voltage characteristics of the structure of FIG. 7A.

FIG. 7A is a view illustrating a structure of the rectifying element of the semiconductor device 30 according to the second embodiment of the present invention, which is obtained by adding the first auxiliary electrode 19 to the structure illustrated in FIG. 6A. FIG. 7B is a view illustrating current-voltage characteristics of the structure of FIG. 7A. The band diagrams of a junction among the first auxiliary electrode 19, barrier layer 21, and channel layer 20 in a rectifying element 32 are the same as those described in the first embodiment, so that a description is made using FIGS. 4A to 4C.

When a voltage lower than that applied to the drain electrode 16 is applied to the anode electrode 31, the same voltage is applied to the first auxiliary electrode 19. The band diagram at that time is as illustrated in FIG. 4A. That is, the two-dimensional electron gas layer is not formed in the channel layer 20, so that the number of carriers is so small that current hardly flows between the anode electrode 31 and cathode electrode 16 (area G of FIG. 7B). As the abovementioned voltage is increased in the positive direction, the band diagram is as illustrated in FIG. 4B at the voltage Vf, which is so-called a flat band state. As the voltage is further increased in the positive direction, the band diagram is as illustrated in FIG. 4C. That is, the two-dimensional electron gas layer 22 is formed in the channel layer 20, and the density of two-dimensional electron gas increases with the increased voltage. As a result, current flows between the anode electrode 18 and cathode electrode 16, and the amount of the current increases with increased voltage. The increase in the amount of the current is brought about by the characteristics of a Schottky barrier diode (area H of FIG. 7B). The voltage Vf is controlled by a higher one of a gate threshold voltage of the first auxiliary electrode 19 and a forward voltage between the anode electrode 31 and 2DEG 22. As described above, the rectifying element 32 has rectifying characteristics.

Figure 8:
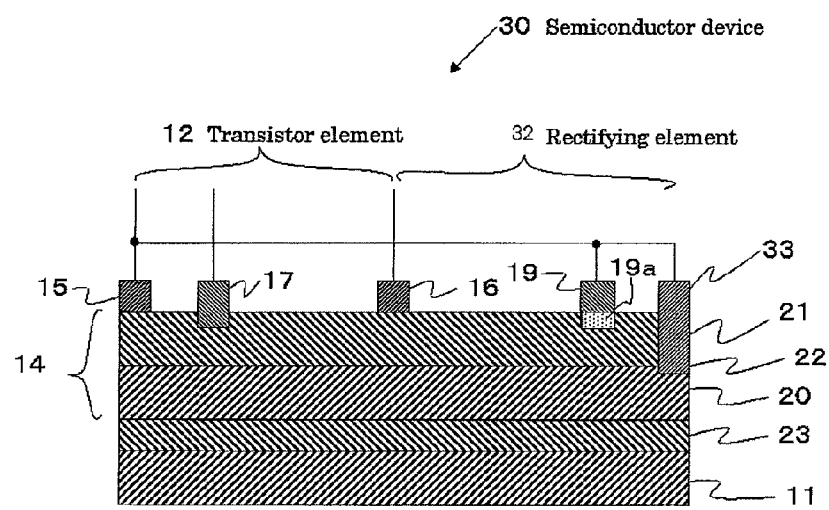
FIG. 8 is a view illustrating a modification of the semiconductor device according to the second embodiment of the present invention.
Figure 9:
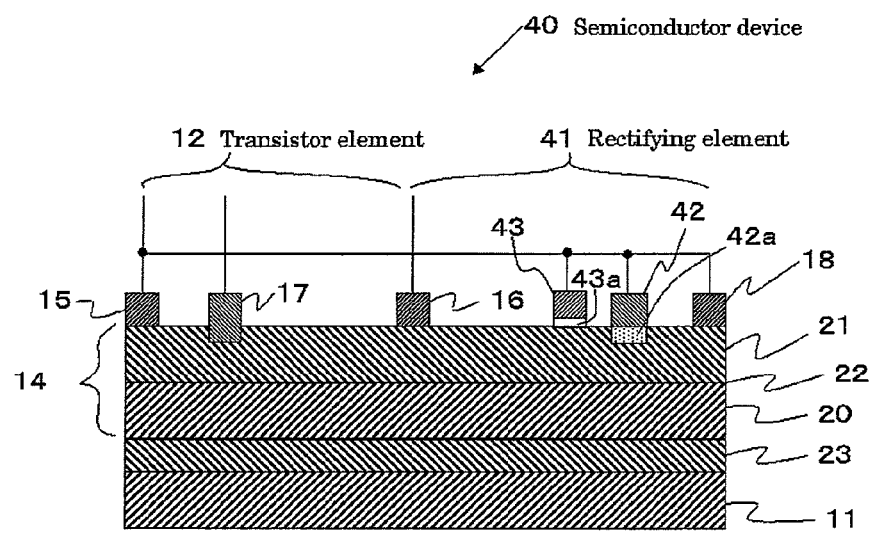
FIG. 9 is a cross-sectional view of a semiconductor device according a third embodiment of the present invention.

In the present embodiment, when a high reverse voltage is applied to the rectifying element 32, a high voltage (high electric field) is applied to the first auxiliary electrode 19. As a result, only a low reverse voltage (around several V to 10 V) is applied to the low Vf rectifying electrode (anode electrode) 31. In general, the low Vf rectifying electrode (anode electrode) 31 has a trade-off that it has a large leak current. However, only a low voltage is applied to the rectifying electrode (anode electrode) 31 in the structure of the present embodiment, so that the rectifying electrode 31 can be made to operate with a reduced leak current. For achieving a low Vf rectifying electrode, it is possible to adopt a recess Schottky structure as illustrated in FIG. 8 in which the two-dimensional electron gas layer 22 and a Schottky electrode 33 are directly contact with each other, as well as to select a Schottky electrode having a small work function.

As described above, there can be provided a semiconductor device in which a diode region having a diode structure capable of reducing a leak current when a high voltage is applied and reducing a Vf (forward voltage drop) and a transistor region are integrally formed.

Next, a semiconductor device according to a third embodiment of the present invention will be described. A semiconductor device 40 according to the third embodiment has the same configuration as that of the first or second embodiment except that the auxiliary electrode of a rectifying element 41 includes a first auxiliary electrode 42 and a second auxiliary electrode 43. Thus, the same reference numerals are given to the same components as in the first embodiment, and the descriptions thereof are omitted. The first auxiliary electrode 42 has the same structure as that of the first auxiliary electrode 19 in the first embodiment. The second auxiliary electrode 43 has the same structure as that of the auxiliary electrode 42 except that it is not provided in the recess structure. That is, p-type semiconductor layers 42a and 43a are formed between the first auxiliary electrode 42 and barrier layer 21 and between the second auxiliary electrode 43 and barrier layer 21, respectively.

In the semiconductor 10 of FIG. 1 having only one auxiliary electrode, there may be a case where the first auxiliary electrode 19 cannot tolerate a high voltage (high electric field). In such a case, when the second auxiliary electrode 43 is combined with the first auxiliary electrode 42, a configuration in which only a low voltage is applied to the first auxiliary electrode 42 can be obtained, thereby allowing the device to operate satisfactorily.

As described above, there can be provided a semiconductor device in which a diode region having a diode structure capable of reducing a leak current when a high voltage is applied and reducing a Vf (forward voltage drop) and a transistor region are integrally formed.

Figure 10:
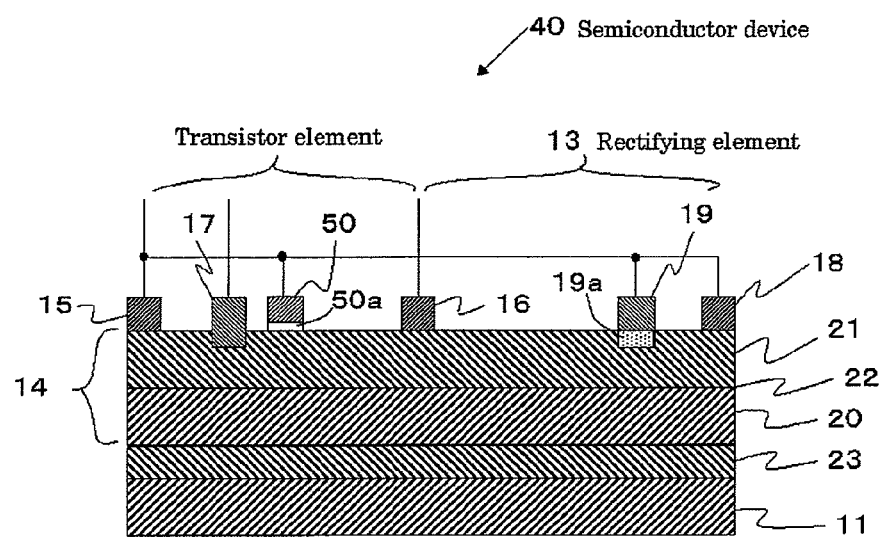
FIG. 10 is a cross-sectional view of a semiconductor device according a fourth embodiment of the present invention.
Figure 11:
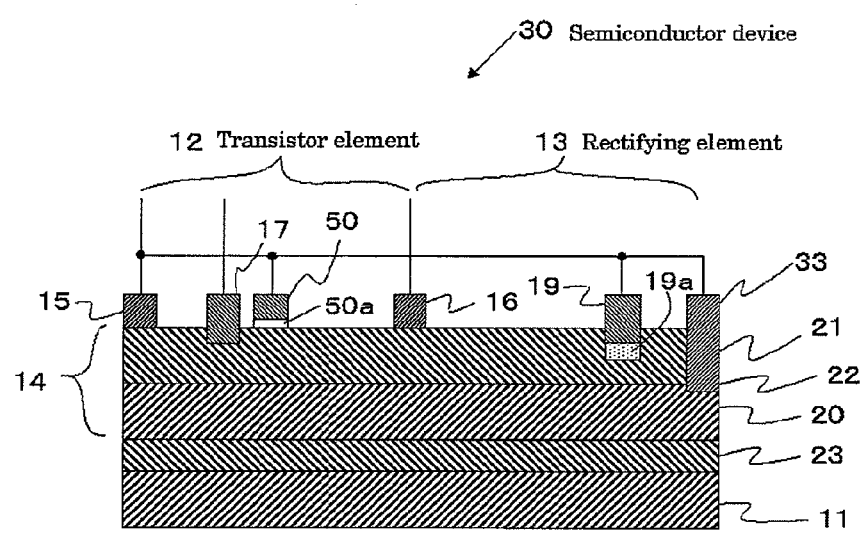
FIG. 11 is a cross-sectional view of a semiconductor device according the fourth embodiment of the present invention.
Figure 12:
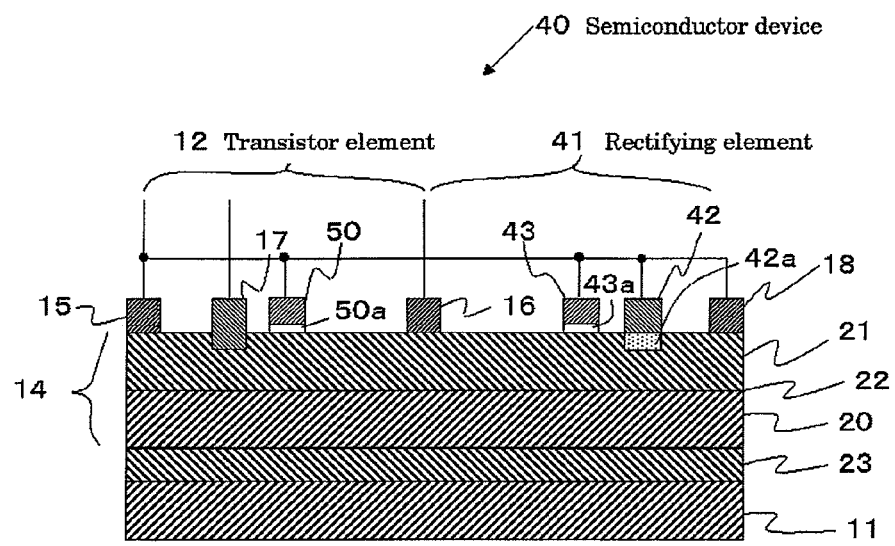
FIG. 12 is a cross-sectional view of a semiconductor device according a fourth embodiment of the present invention.
Figure 13:
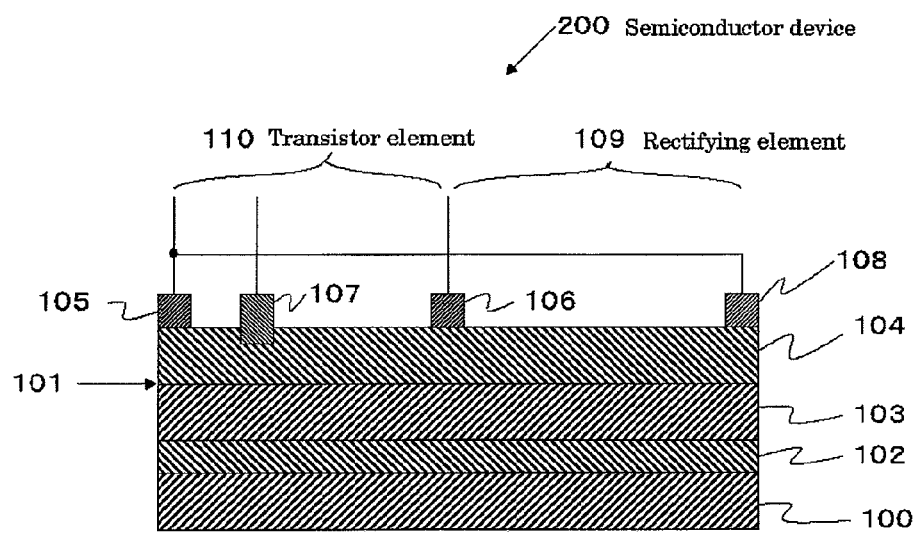
FIG. 13 is a cross-sectional view of a conventional semiconductor device.

Next, a semiconductor device according to a fourth embodiment of the present invention will be described. As illustrated in FIGS. 10 to 12, in the fourth embodiment, an auxiliary electrode 50 having the same structure as that of the second auxiliary electrode 43 is added to also the transistor element of the semiconductor device of each of the first to third embodiments as illustrated in FIGS. 1 to 9. Except for the above, the semiconductor device of the fourth embodiment has the same configuration as that of the semiconductor device according to each of the first to third embodiments. Thus, the same reference numerals are given to the same components as in the first to third embodiments, and the descriptions thereof are omitted.

As illustrated in FIGS. 10 to 12, by adding the auxiliary electrode 50 having the same structure as that of the second auxiliary electrode 43 also to the transistor element, a reduction in the leak current of the transistor element can be achieved. Particularly, as illustrated in FIG. 12, the structures of the portions of the transistor element and rectifying element to which a high voltage (high electric field) is applied are entirely the same as each other, so that withstand voltage design of the device can be simplified. Further, there is obtained an advantage that charging/discharging between the auxiliary electrode 50 to which a high voltage is applied and drain electrode 50 is performed only through a main circuit with a low impedance, allowing high-speed switching operation. On the other hand, charging/discharging between the gate and drain electrodes in the structure in which the auxiliary electrode 50 is not provided is performed through a gate circuit having a specified impedance, so that the speed of the switching operation is relatively low.

Further, in the semiconductor device of each of the first to fourth embodiments, the rectifying operation of the rectifying element is performed in a unipolar fashion, reverse direction recovery characteristics can be enhanced as compared to a body diode of a general silicon MOSFET or a silicon FRD.

The structure of FIG. 12 provides the simplest process and simplifies withstand voltage design. The Vf at the time of reverse conduction is equal to the gate threshold voltage Vth of the transistor element, so that when a reduction in the Vf is achieved, the transistor element can be driven with a low voltage. The gate structure of the transistor element is assumed to be able to obtain normally-off characteristics resulting from a combination of the recess structure and p-type semiconductor material. The auxiliary electrode 50 is formed using a p-type semiconductor material same as the gate, but the recess structure is not applied thereto. A gate voltage of not less than +10 V is required for turning ON a conventional high voltage silicon MOSFET. However, according to the present structure, Vth is made equal to Vf, so that when device is designed in accordance with the Vf, a transistor element that is turned ON with about +3 V to +5 V can be realized at the same time.

For achieving stable operation at the time of application of a high voltage, it is preferable to add a field plate structure. A field plate electrode is preferably electrically connected to the auxiliary electrode opposite to the drain electrode or source electrode. The gate electrode may be formed by combining materials such as a Schottky metal material, a p-type semiconductor material, and an insulating material (MIS structure) and a recess structure. The characteristics of the gate electrode may be either a normally-on type or normally-off type. All the structures described above may be applied to the devices of FIGS. 1 to 12. The present invention may be applied not only to a simple hetero structure of AlGaN/GaN but also to a GaN/AlGaN/AlN/GaN structure to which a cap layer and a spacer layer are added. Further, the present invention may be applied to a FET structure that does not use two-dimensional gas as a channel layer, a MESFET structure using, e.g., a n-type GaN layer as a channel layer, and a MOSFET structure using an inversion channel layer.

The configuration, shape, size, and layout described in the above embodiments are only shown in general to an extent enabling the present invention to be understood and carried out, and numerical values and compositions (materials) of configurations are merely examples. Therefore, the present invention is not limited to the embodiments described above and can be modified in various ways so long as the scope of the technical idea shown in the claims is not exceeded. Further, the embodiments described above may be combined so as to achieve the present invention.

A semiconductor device according to the present invention is utilized as a semiconductor device as a power element for high-frequency/high voltage operation.

What is claimed is:

1. A semiconductor device comprising:
a transistor element comprising a first nitride semiconductor layer and a second nitride semiconductor layer formed on the first nitride semiconductor layer, wherein
a current flows between a source electrode formed on the second nitride semiconductor layer and a drain electrode formed on the second nitride semiconductor layer, the current flowing through a two-dimensional carrier gas layer formed near a heterojunction between the first nitride semiconductor layer and the second semiconductor layer, and
ON/OFF operation is controlled by a voltage applied to a gate electrode formed on the second nitride semiconductor layer between the source electrode and the drain electrode; and
a rectifying element comprising a cathode electrode identical to the drain electrode, and an anode electrode disposed on the second nitride semiconductor layer, wherein the current flows between the cathode electrode and the anode electrode, wherein
a first auxiliary electrode and a second auxiliary electrode are formed on the second nitride semiconductor layer between the anode electrode and the source electrode in order from the anode electrode to the cathode electrode.

2. The semiconductor device according to claim 1, wherein the source electrode, the anode electrode, and the first auxiliary electrode are electrically connected to one another.

3. The semiconductor device according to claim 1, wherein a third auxiliary electrode is formed on the transistor element at a portion between the gate electrode and drain electrode.

4. The semiconductor device according to claim 1, wherein the anode electrode is an electrode ohmic-contacting with the second nitride semiconductor layer.

5. The semiconductor device according to claim 1, wherein the anode electrode is an electrode Schottky-contacting with the second nitride semiconductor layer.

6. The semiconductor device according to claim 1, wherein the first auxiliary electrode has a function of controlling a carrier density of the two-dimensional carrier gas layer, and a higher barrier is formed between the second auxiliary electrode and the second nitride semiconductor layer than between the anode electrode and the second nitride semiconductor layer.

* * * * *